(12) United States Patent
Yokoyama et al.

(10) Patent No.: US 9,093,338 B2
(45) Date of Patent: Jul. 28, 2015

(54) SEMICONDUCTOR DEVICE HAVING CHIP-ON-CHIP STRUCTURE

(71) Applicant: Panasonic Corporation, Osaka (JP)

(72) Inventors: Kenji Yokoyama, Kyoto (JP); Takeshi Kawabata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/132,079

(22) Filed: Dec. 18, 2013

(65) Prior Publication Data

US 2014/0103502 A1 Apr. 17, 2014

Related U.S. Application Data

(63) Continuation of application No. PCT/JP2012/005300, filed on Aug. 24, 2012.

(30) Foreign Application Priority Data

Oct. 20, 2011 (JP) ................. 2011-230470

(51) Int. Cl.
*H01L 23/00* (2006.01)
*H01L 23/31* (2006.01)
*H01L 23/495* (2006.01)
*H01L 25/065* (2006.01)
*H01L 23/498* (2006.01)

(52) U.S. Cl.
CPC ............ *H01L 24/14* (2013.01); *H01L 23/3128* (2013.01); *H01L 23/49575* (2013.01); *H01L 25/0652* (2013.01); *H01L 25/0657* (2013.01); *H01L 23/3114* (2013.01); *H01L 23/49827* (2013.01); *H01L 2224/1403* (2013.01); *H01L 2224/48091* (2013.01); *H01L 2224/48227* (2013.01); *H01L 2225/0651* (2013.01); *H01L 2225/06506* (2013.01); *H01L 2225/06513* (2013.01); *H01L 2225/06517* (2013.01); *H01L 2225/06562* (2013.01)

(58) Field of Classification Search
CPC ....................................................... H01L 24/14
See application file for complete search history.

(56) References Cited

U.S. PATENT DOCUMENTS

| | | | | | |
|---|---|---|---|---|---|
| 5,012,323 | A | * | 4/1991 | Farnworth | 257/723 |
| 5,343,075 | A | * | 8/1994 | Nishino | 257/686 |
| 6,326,693 | B1 | * | 12/2001 | Mimoto et al. | 257/773 |
| 6,472,746 | B2 | * | 10/2002 | Taniguchi et al. | 257/723 |
| 7,166,912 | B2 | * | 1/2007 | Tzeng et al. | 257/712 |

(Continued)

FOREIGN PATENT DOCUMENTS

| | | |
|---|---|---|
| JP | 11-177020 | 7/1999 |
| JP | 2005-183934 | 7/2005 |

(Continued)

OTHER PUBLICATIONS

International Search Report of PCT Application No. PCT/JP2012/005300 dated Nov. 20, 2012.

*Primary Examiner* — William Coleman
(74) *Attorney, Agent, or Firm* — Panasonic Patent Center

(57) ABSTRACT

A semiconductor device includes: a first semiconductor chip held on a substrate and including an expanded portion expanding outward from a side surface of a body of the first semiconductor chip; a first wire connecting the expanded portion of the first semiconductor chip to the substrate; and a second wire connecting the body of the first semiconductor chip to the substrate.

18 Claims, 10 Drawing Sheets

(56) References Cited

U.S. PATENT DOCUMENTS

| | | |
|---|---|---|
| 7,429,792 B2 * | 9/2008 | Lee et al. ............... 257/712 |
| 7,566,961 B2 * | 7/2009 | Cho ....................... 257/686 |
| 2005/0121802 A1 | 6/2005 | Kawano et al. |
| 2006/0163728 A1 * | 7/2006 | Nakanishi et al. ......... 257/738 |
| 2012/0133381 A1 * | 5/2012 | Bruland et al. ....... 324/754.03 |

FOREIGN PATENT DOCUMENTS

| | | |
|---|---|---|
| JP | 2006-203079 | 8/2006 |
| JP | 2007-207805 | 8/2007 |
| JP | 2010-141080 | 6/2010 |

\* cited by examiner

SEMICONDUCTOR DEVICE HAVING CHIP-ON-CHIP STRUCTURE

CROSS-REFERENCE TO RELATED APPLICATIONS

This is a continuation of International Application No. PCT/JP2012/005300 filed on Aug. 24, 2012, which claims priority to Japanese Patent Application No. 2011-230470 filed on Oct. 20, 2011. The entire disclosures of these applications are incorporated by reference herein.

BACKGROUND

The present disclosure relates to semiconductor devices having chip-on-chip structures.

With recent miniaturization of semiconductor fabrication techniques, the number of transistors used for large scale integration (LSI) has been increasing. In addition, as components, especially systems, constituting LSI have become more and more complicated in larger scales, the memory capacity required for so-called system LSI have been expected to increase. In terms of cost, one of the most important issues is highly efficient assembly in system LSI incorporating a large-scale memory circuit.

To connect LSI to a package, wire bonding or flip-chip bonding is generally employed. In these bonding techniques, a memory circuit needs to be incorporated into a chip of system LSI itself or mounted on a mother substrate or a circuit substrate on which an LSI chip is mounted. Incorporation of a memory circuit into a chip is affected by the memory capacity. Mounting a memory circuit on a substrate has problems including an increased area of the substrate itself and an increased cost for mounting.

A chip-on-chip (COC) structure is a solution for the foregoing problems. FIG. 16 illustrates a cross section of a typical COC structure as described in, for example, Japanese Unexamined Patent Publication No. 2010-141080. As illustrated in FIG. 16, a first chip 11 and a second chip 12 each having an element formation surface on which a plurality of pads are provided are electrically connected to each other via bumps 14, and bonded to each other by an underfill resin material 15.

The first chip 11 is bonded to a substrate 13 such as a wiring substrate with a surface of the first chip 11 opposite to the second chip 12 facing the substrate 13. The upper surface (i.e., the element formation surface) of the first chip 11 is provided with pads for wire bonding, and electrically connected to the substrate 13 by wires 16. The first chip 11, the second chip 12, and the wires 16 are covered with a molding resin 17 (only whose outer contour is shown).

The use of the above-described COC structure enables the multiple chips 11 and 12 to be mounted on the substrate 13, and thus, achieves efficient bonding of a plurality of chips in a small area, as compared to typical wire bonding or flip-chip bonding techniques.

Japanese Unexamined Patent Publications Nos. 2007-207805 and 2005-183934 show configurations in each which a second semiconductor chip, which is located above a first semiconductor chip, does not coincide with the first semiconductor chip in plan view.

SUMMARY

The technique described in Japanese Unexamined Patent Publication No. 2010-141080, however, is based on the assumption that the upper chip is smaller than the lower chip. If the size of the lower chip is equal to or smaller than that of the upper chip, the lower chip cannot have a wire bonding region thereon. In such a case, a rewiring region is provided on a chip by increasing the size of the lower chip to compensate for the above problems. This technique, however, involves an increase in wiring resistance as well as a rise in cost.

The techniques described in Japanese Unexamined Patent Publications Nos. 2007-207805 and 2005-183934 cannot obtain the necessary number of terminals even by disposing the upper and lower chips at different positions in plan view in a configuration where the size of the first semiconductor chip is equal to or smaller than that of the second semiconductor chip located above the first semiconductor chip. In addition, since wire bonding terminals are locally located only on one side of the chip, a wiring pattern on the circuit substrate becomes complicated, leading to a rise in cost. Furthermore, the first semiconductor chip is not present under part of the second semiconductor chip, causing the problem of poor reliability of quality after assembly.

It is therefore an object of the present disclosure to reduce malfunctions in timing performance and function due to a variation of the operating speed by enabling bonding of the principal surface of a chip to a substrate irrespective of the sizes of upper and lower chips and by reducing wiring resistance from the principal surface of the chip to the substrate.

It is another object of the present disclosure to achieve enhanced function by increasing the number of bonding terminals for COC bonding even when the upper and lower chips do not coincide with each other in plan view, irrespective of the size relationship between the upper and lower chips.

It is still another object of the present disclosure to obtain reliable quality after assembly by reducing a gap between the upper semiconductor chip and the substrate.

In the present disclosure, it is sufficient to achieve at least one of the above objects.

To achieve at least one of the above-described objects, in a semiconductor device with a COC structure according to the present disclosure, one chip has an extension portion, and another chip is disposed so as not to cover part of a semiconductor region of the former chip, such that terminals on the semiconductor region can be connected to a substrate by a conductive member.

Inventors of the present disclosure have tried various methods in order to reduce the influence of chip malfunctions due to a wiring delay caused by increased resistance resulting from the presence of leads (re-distribution lines) on, for example, a lower chip expanded by using a resin material or other materials, and obtained the following findings. Specifically, to reduce the resistance of lead lines from a chip irrespective of the size relationship between the upper and lower chips, the upper chip is disposed so as not to cover part of bonding terminals (on-chip terminals) on a semiconductor region of the chip so that the on-chip terminals can be directly connected (bonded) to the substrate. This configuration can reduce the wiring resistance and increase the number of bonding terminals, thereby reducing malfunctions of LSI due to, for example, a variation in operating speed among the chips.

Specifically, a first semiconductor device according to the present disclosure includes: a base; a first semiconductor chip held on or above the base and including an extension portion expanding outward from a side surface of the body; a first conductive member connecting the extension portion of the first semiconductor chip to the base; and a second conductive member connecting a body of the first semiconductor chip to the base.

In the first semiconductor device, the extension portion of the first semiconductor chip as a lower chip can enhance the degree of freedom of mounting the upper chip and the degree of freedom of bonding the chip to the base even in a case where the size of a lower chip is equal to or smaller than the upper chip. In addition, bonding not only the extension portion but also the body of the chip to the base by the second conductive member can achieve wiring with low resistance even in a circuit configuration requiring high-speed operate. Furthermore, the number of terminals can be increased without a rise in cost for assembly. Moreover, since no gap is formed between the first semiconductor chip and the base, reliable quality after assembly can be obtained.

The first semiconductor device preferably further includes a second semiconductor chip bonded to the first semiconductor chip and connected to the first semiconductor chip via a bump.

In this case, in the first semiconductor device, the second semiconductor chip may include a plurality of semiconductor chips.

The presence of the multiple second semiconductor chips as upper chips can meet requirements for a large-scale circuit.

In the first semiconductor device, the extension portion of the first semiconductor chip may be provided only on one side of the body.

In the first semiconductor device, the extension portion of the first semiconductor chip may be provided only on two sides of the body.

In the first semiconductor device, the extension portion of the first semiconductor chip may be provided on three sides of the body.

In this manner, the extension portion of the first semiconductor chip can be appropriately provided in consideration of the size relationship between the first semiconductor chip and the second semiconductor chip and the necessity of high-speed operation of each of the semiconductor chip, for example.

In a case where the first semiconductor device includes the second semiconductor chip, at least three sides of the body of the first semiconductor chip may not coincide with the associated sides of the second semiconductor chip in plan view.

In this configuration, the boundary between the extension portion and the body in the first semiconductor chip does not overlap a peripheral portion of the second semiconductor chip, and thus, wiring can be designed with low resistance even in a circuit configuration that needs to operate at high speed. In addition, it is possible to avoid concentration of stress on the boundary between the body and the extension portion in the first semiconductor chip, resulting in reduction of cost for assembly.

A second semiconductor device according to the present disclosure includes: a base; a first semiconductor chip bonded to the base, having a body, and including an extension portion expanding outward from a side surface of the body; a plurality of second semiconductor chips bonded to the first semiconductor chip and connected to the first semiconductor chip via bumps; and a first conductive member connecting the extension portion of the first semiconductor chip to the base.

The second semiconductor device is advantageously applicable to a large-scale circuit by mounting the multiple second semiconductor chips as upper chips, in addition to the advantages of the first semiconductor device. Thus, the function can be enhanced by increasing the number of terminals on the chips at reduced cost.

The second semiconductor device preferably further includes a second conductive member connecting the body of the first semiconductor chip to the base.

In the second semiconductor device, the first semiconductor chip is connected to the base only by the first conductive member provided on the extension portion of the first semiconductor chip.

The first semiconductor device may further include: a second semiconductor chip having an element formation surface, held on the first semiconductor chip with a surface opposite to the element formation surface facing the first semiconductor chip; and a third conductive member connecting the second semiconductor chip to at least the body of the extension portion and the body of the first semiconductor chip.

Thus, the second semiconductor chip as an upper chip can be bonded by wires as the third conductive member without being flip-chip bonded to the first semiconductor chip.

In this case, the first semiconductor device may further include a fourth conductive member connecting the second semiconductor chip to the extension portion of the first semiconductor chip.

The first semiconductor device may further include a second semiconductor chip held between the first semiconductor chip and the base and connected to the first semiconductor chip via a first bump, the first conductive member may be a second bump, and the second conductive member may be a third bump.

In this manner, the presence of the extension portion of the first semiconductor chip as an upper chip can enhance the degree of freedom of mounting one or more second semiconductor chips and the degree of freedom of bonding the one or more second semiconductor chips to the base even in a case where the lower second semiconductor chips are larger than the first semiconductor chip. In addition, the second bump on the extension portion of the first semiconductor chip can increase the number of terminals.

In the first or second semiconductor device, a re-distribution line connecting the first conductive member to the body may be provided on the extension portion of the first semiconductor chip.

In the first or second semiconductor device, a side surface of the extension portion of the first semiconductor chip is preferably located outside an outermost side surface of the second semiconductor chip in plan view.

In the first or second semiconductor device, the base may be a wiring substrate.

In the first or second semiconductor device, the base may be a lead frame.

In a semiconductor device according to the present disclosure, the number of bonding terminal for COC bonding can be increased irrespective of the chip size, and the wiring resistance from the principal surface of a chip to a base can be reduced. In addition, malfunctions of timing performance and function due to, for example, a variation in operating speed can be reduced, and the function can be enhanced by increasing the number of terminals at low cost. Further, since no gap is formed between the upper semiconductor chip and the base, the reliability of quality after assembly can be enhanced.

DETAILED DESCRIPTION

First Embodiment

A semiconductor integrated circuit device according to a first embodiment of the present disclosure will be described with reference to FIGS. 1 and 2.

Figure 1:
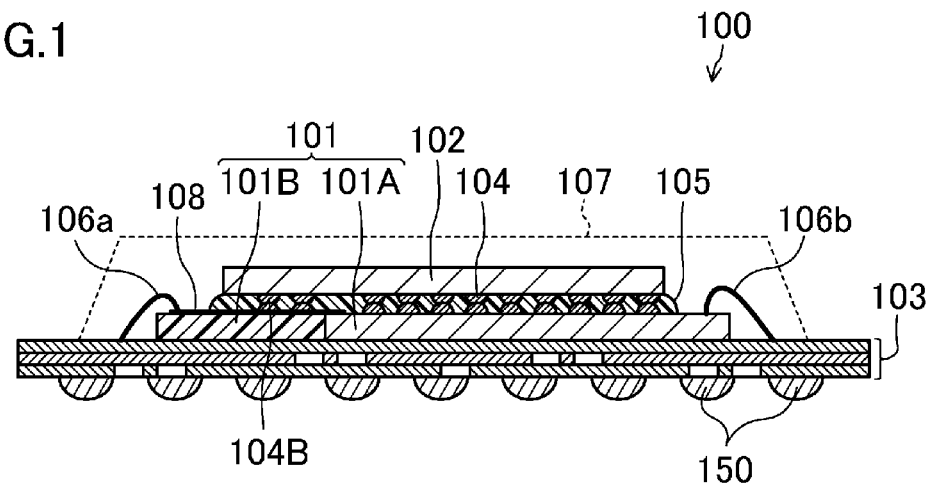
FIG. 1 illustrates a semiconductor integrated circuit device according to a first embodiment and taken along line I-I in FIGS. 2, 3, 4, and 5.
Figure 2:
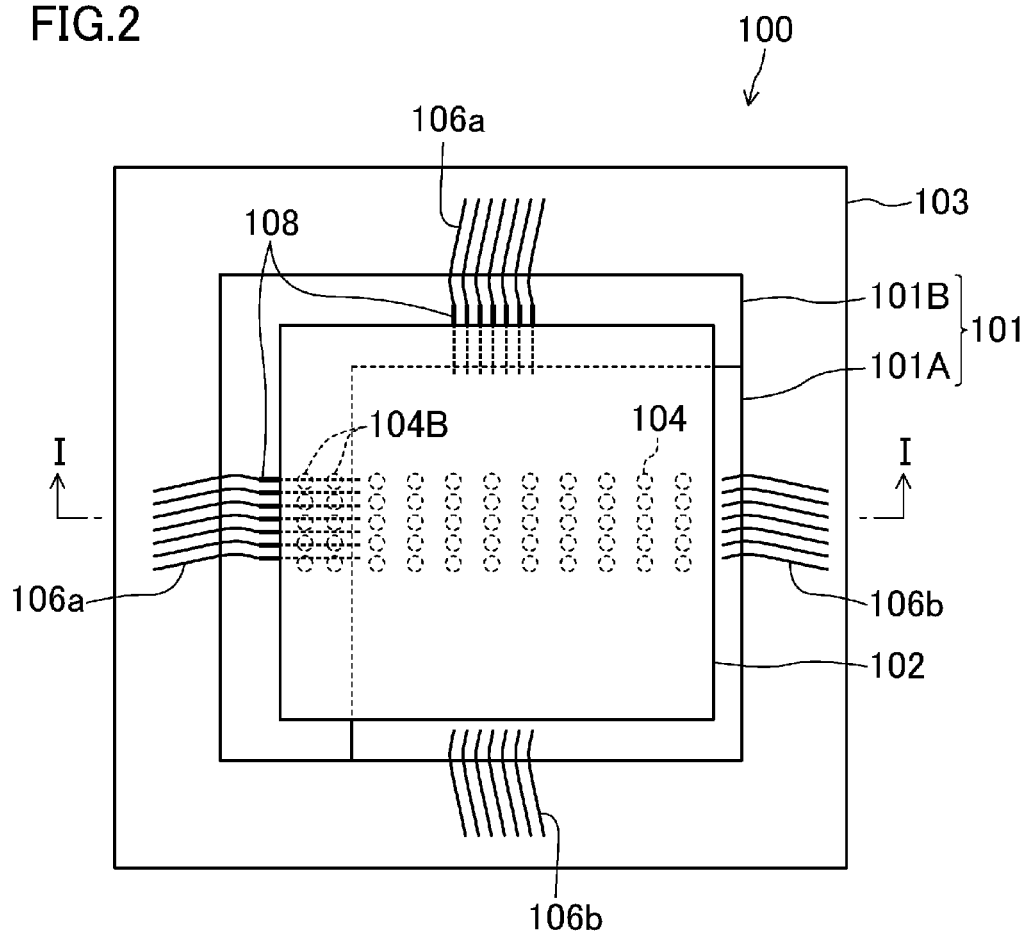
FIG. 2 is a plan view illustrating the semiconductor integrated circuit device of the first embodiment.

As illustrated in FIGS. 1 and 2, a semiconductor integrated circuit device 100 of the first embodiment includes: a first semiconductor chip 101 (hereinafter simply referred to as a first chip 101); a second semiconductor chip 102 (hereinafter simply referred to as a second chip 102) located above the first chip 101 and bonded to the first chip 101 by an underfill material 105 interposed therebetween; and a substrate 103 including a stack of interconnect layers and having a principal surface to which the first chip 101 is bonded.

The first chip 101 includes a body 101A of, for example, silicon (Si) and an expanded portion 101B of, for example, a resin material. The expanded portion 101B expands outward from side surfaces of the body 101A in two directions in parallel with the principal surface (i.e., the element formation surface). A plurality of pads (not shown) are provided on the principal surface of the body 101A. The body 101A and the expanded portion 101B are electrically connected to each other via re-distribution lines 108 connected to the pads.

The re-distribution lines 108 are connected to wire bonding pads on the expanded portion 101B, and are electrically connected to the substrate 103 via first wires 106a serving as a first conductive member. The pads on the body 101A are electrically connected to the substrate 103 via second wires 106b serving as a second conductive member.

The second chip 102 has an element formation surface (i.e., the lower surface) on which a plurality of pads are provided. These pads face, and are electrically connected to, the pads on the element formation surface (i.e., the upper surface) of the first chip 101 via bumps 104, or are electrically connected to the re-distribution lines 108 via bumps 104B on the expanded portion 101B.

A molding resin 107 (only whose outer contour is shown) formed on the principal surface of the substrate 103 covers the first chip 101 including the expanded portion 101B and the re-distribution lines 108 provided thereon, the second chip 102, the first wires 106a, and the second wires 106b.

A plurality of bumps 150 are provided on a surface (i.e., the lower surface) of the substrate 103 opposite to the surface covered with the molding resin 107, and are electrically connected to interconnects and vias in the substrate 103.

In this manner, the semiconductor integrated circuit device 100 of the first embodiment has a chip-on-chip (COC) structure in which the second chip 102 is flip-chip connected to the first chip 101.

In this structure, especially in a case where the chip size of the first chip 101 is equal to or smaller than that of the second chip 102, the presence of the expanded portion 101B of the first chip 101 enables the number of bonding terminals on the first chip 101 to be increased irrespective of the size relationship of the lower first chip 101.

In addition, in the first embodiment, the pads on the body 101A, as well as the pads on the expanded portion 101B, of the first chip 101 are electrically connected to the substrate 103 via the second wires 106b. Consequently, wiring can be designed with low resistance even in a circuit configuration in which the semiconductor integrated circuit device 100 needs to operate at high speed. The first wires 106a provided to the expanded portion 101B and the second wires 106b provided to the body 101A enable necessary bonding terminals to be provided on a portion of the principal surface of the substrate 103 facing a peripheral portion of the first chip 101. The electrical connection of the first wires 106a provided to the expanded portion 101B and the second chip 102 to the re-distribution lines 108 via the bumps 104B enables not only an increased number of terminals to be connected to the second chip 102 but also wiring to be designed with low resistance. As a result, the number of terminals can be increased without a rise in cost for assembly.

Accordingly, the wiring resistance from the principal surface of the first chip 101 to the substrate 103 can be reduced, and thus, malfunctions of timing performance and function due to a variation in operating speed can be reduced. As a result, the function can be enhanced at low cost by increasing the number of terminals.

In addition, since no gap is formed between the second chip 102 and the substrate 103, the reliability of this integrated circuit device after assembly can be obtained.

The resin material constituting the expanded portion 101B of the first chip 101 may be an epoxy resin, for example. A material constituting the expanded portion 101B is not limited to a resin material, and may be other materials such as a Fe—Ni-based alloy or a Cu-based alloy, for example. In the case of using a conductive material such as a metal for the expanded portion 101B, an insulating material needs to be interposed between the expanded portion 101B and the re-distribution lines 108 when the re-distribution lines 108 are provided on the expanded portion 101B. Materials constituting the expanded portion 101B except the resin material are applicable to the following embodiments and variations thereof.

In this embodiment, the second chip 102 needs to be mounted on the first chip 101 in such a manner that at least one of the other two sides, i.e., the sides on which the expanded portion 101B are not provided, of the body 101A of the first chip 101 projects outward from an associated side of the second chip 102 in plan view. In a case where two or more sides of the body 101A project outward from the second chip 102, the second wires 106b are also provided on a portion on at least one side.

In this embodiment, the planar shape of each of the first chip 101 and the second chip 102 is rectangular, but is not limited to this shape. For example, the present disclosure is applicable to cases where the first chip 101 and the second chip 102 are triangular, or polygons having five or more corners. The same holds true for the following embodiments and variations thereof.

(First Variation of First Embodiment)

Figure 3:
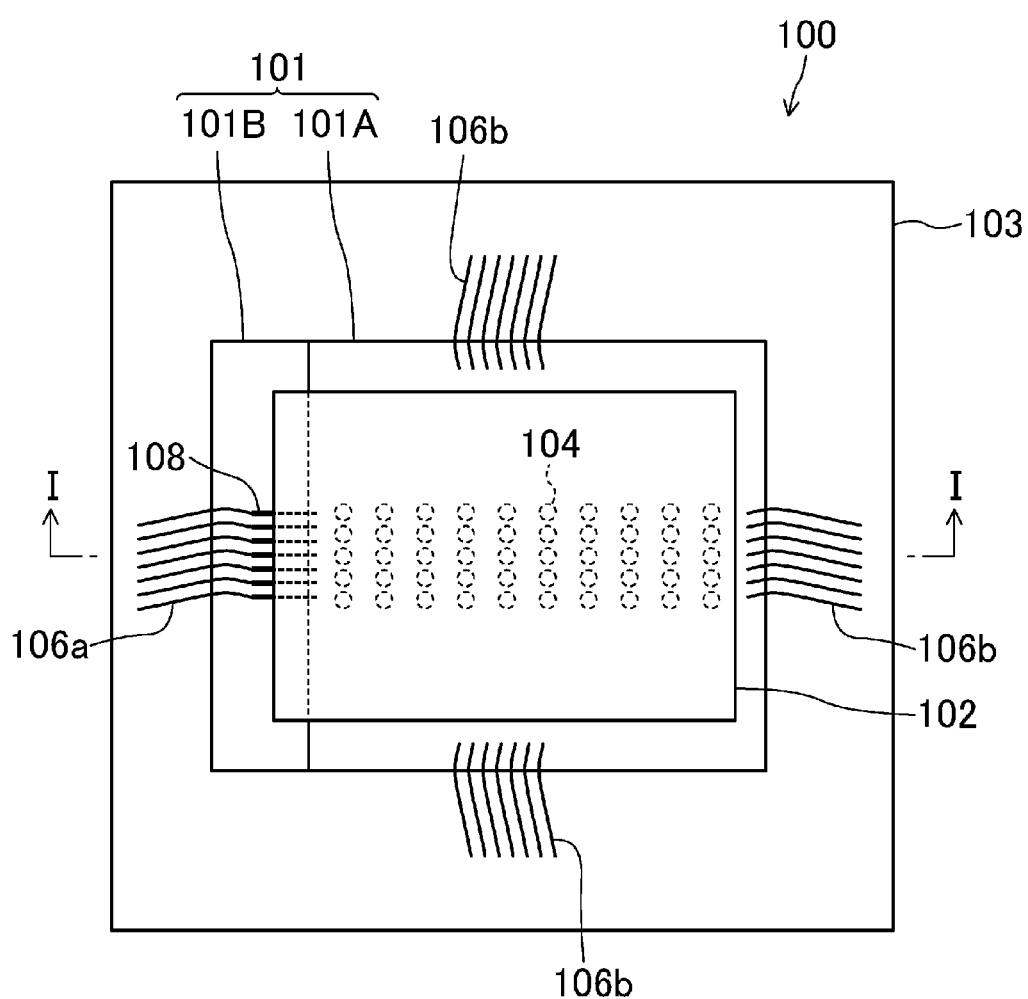
FIG. 3 is a plan view illustrating a semiconductor integrated circuit device according to a first variation of the first embodiment.

As illustrated in FIG. 3, in a semiconductor integrated circuit device 100 according to a first variation of the first embodiment, the expanded portion 101B of the first chip 101 is provided only on a side of the body 101A of the first chip 101.

In the first variation, the second chip 102 needs to be mounted on the first chip 101 such that at least one of the other three sides, i.e., the sides on which the expanded portion 101B are not provided, of the body 101A of the first chip 101 projects outward from an associated side of the second chip 102 in plan view. In a case where two or more side portions of the body 101A project outward, the second wires 106b still only need to be located on at least one of the side portions.

(Second Variation of First Embodiment)

Figure 4:
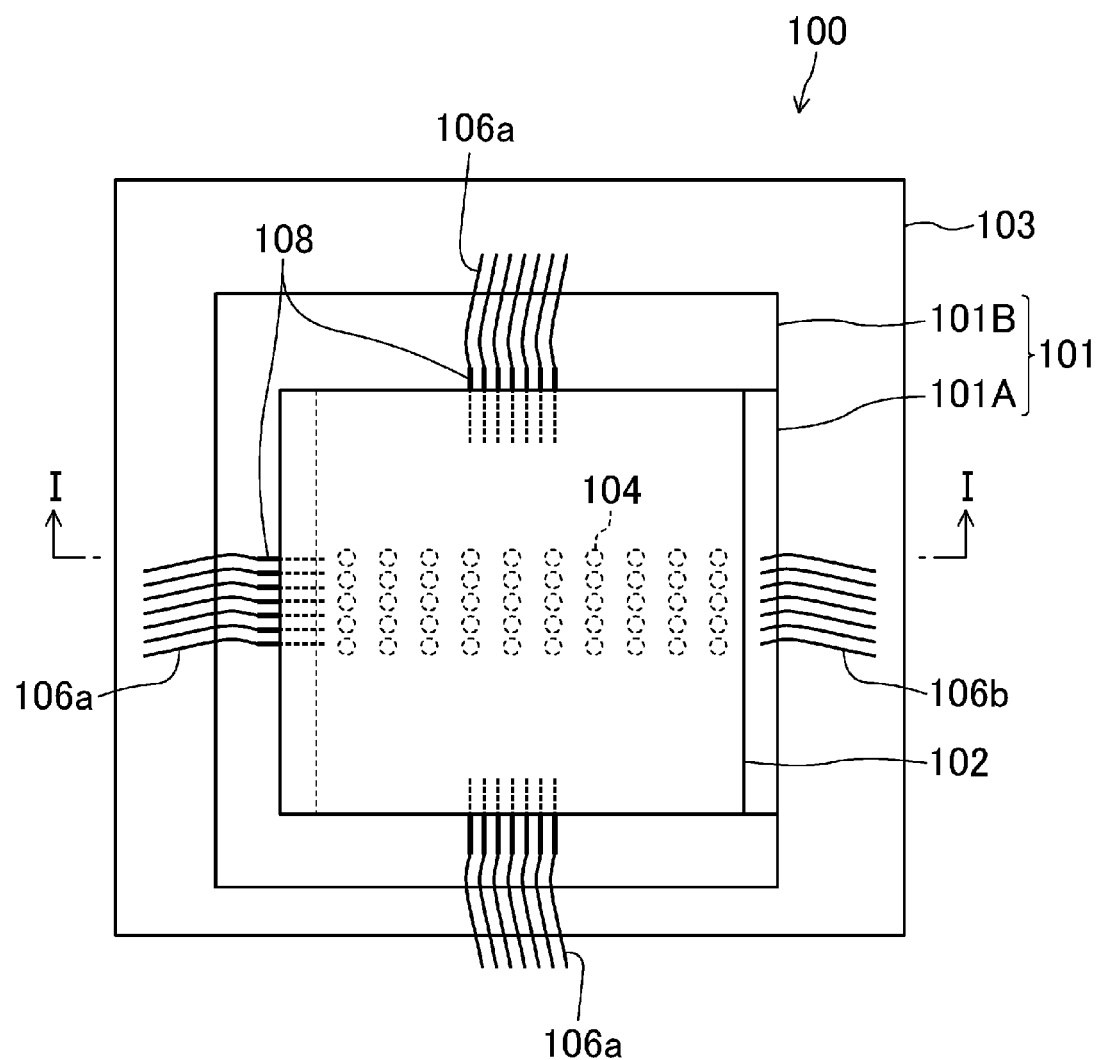
FIG. 4 is a plan view illustrating a semiconductor integrated circuit device according to a second variation of the first embodiment.

As illustrated in FIG. 4, in a semiconductor integrated circuit device 100 according to a second variation of the first embodiment, the expanded portion 101B of the first chip 101 is provided on three sides of the body 101A of the first chip 101.

In the second variation, the second chip 102 needs to be mounted on the first chip 101 such that the other side of the body 101A of the first chip 101 projects outward from an associated side of the second chip 102 in plan view.

As described in the first embodiment and the variations thereof, the expanded portion 101B of the first chip 101 may be designed as necessary in consideration of the size relationship between the first chip 101 and the second chip 102 and the necessity of high-speed operation of the chips 101 and 102.

(Third Variation of First Embodiment)

Figure 5:
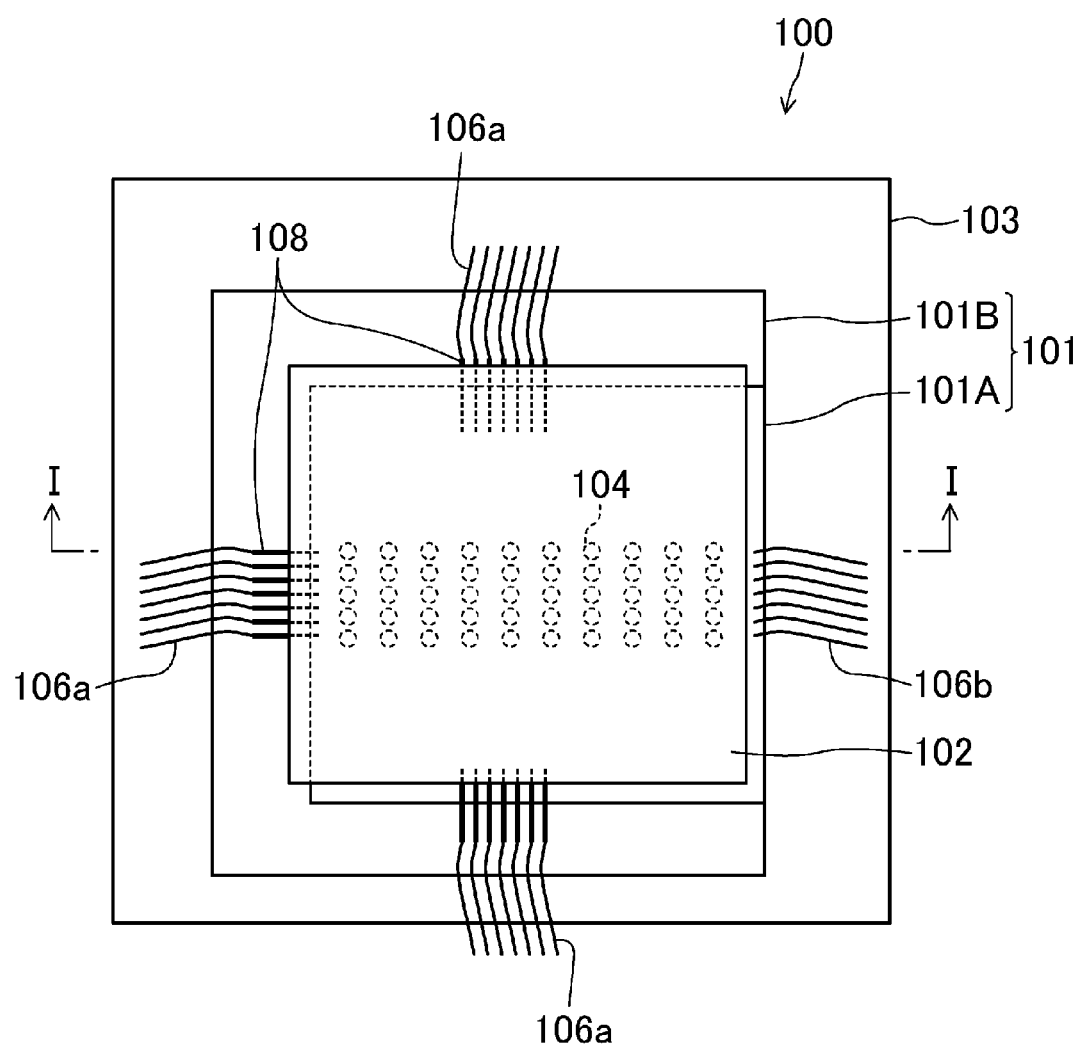
FIG. 5 is a plan view illustrating a semiconductor integrated circuit device according to a third variation of the first embodiment.

As illustrated in FIG. 5, in a semiconductor integrated circuit device 100 according to a third variation of the first embodiment, at least three sides of the body 101A of the first chip 101 do not coincide with the associated three sides of the second chip 102 in plan view.

This positional difference of the side surfaces between the first chip 101 and the second chip 102 can avoid concentration of stress on the boundary between the body 101A and the expanded portion 101B in the first chip 101.

Second Embodiment

Figure 6:
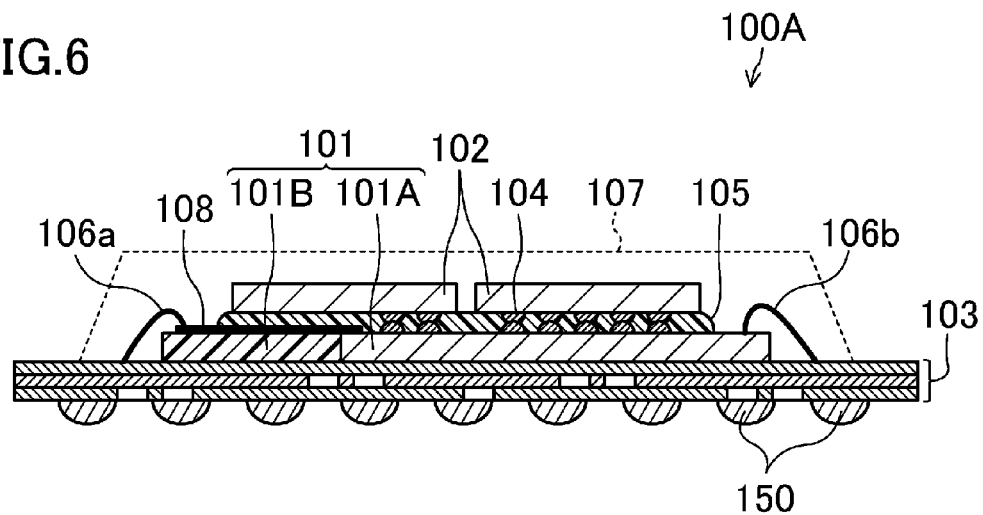
FIG. 6 is a cross-sectional view illustrating a semiconductor integrated circuit device according to a second embodiment and taken along line VI-VI in FIG. 7.
Figure 7:
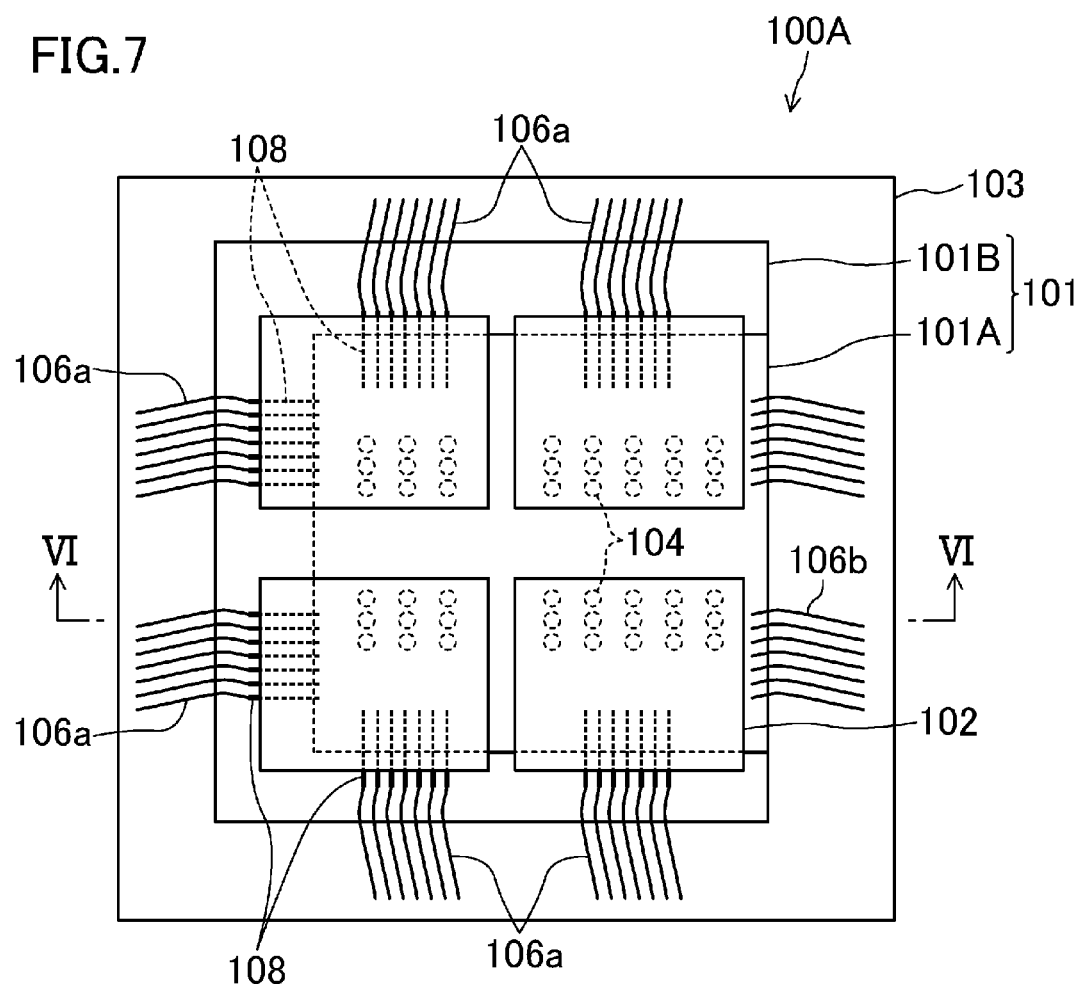
FIG. 7 a plan view illustrating the semiconductor integrated circuit device of the second embodiment.

A semiconductor integrated circuit device according to a second embodiment of the present disclosure will be described with reference to FIGS. 6 and 7. In FIGS. 6 and 7, components already shown in FIGS. 1 and 2 are denoted by the same reference characters.

As illustrated in FIGS. 6 and 7, a semiconductor integrated circuit device 100A according to the second embodiment includes a plurality of second chips 102 as upper chips in a COC structure.

In this embodiment, four second chips 102 are used, for example. All the chips 102 may have different functions, or at least two of the chips 102 may have an identical function.

The four second chips 102 are disposed such that the outer sides of the second chips 102 are located outside three sides of a first chip 101. Thus, the first chip 101 includes an expanded portion 101B located on three sides of a body 101A of the first chip 101 from which the sides of the second chips 102 project outward in plan view.

In the manner similar to that of the first embodiment, the other side of the principal surface of the body 101A of the first chip 101 needs to project outward from the side of the second chip 102 in plan view such that second wires 106b can be provided thereon.

The expanded portion 101B of the first chip 101 may be provided on two sides as illustrated in FIG. 2 or on one side as illustrated in FIG. 3, depending on the relationship between the chip size of the first chip 101 and the chip size of the second chips 102.

In the second embodiment, especially in a case where the chip size of the lower first chip 101 is equal to or smaller than the area necessary for mounting the upper second chips 102, the presence of the expanded portion 101B on at least one side of the first chip 101 enables the number of bonding terminals on the first chip 101 to be increased irrespective of the size relationship of the lower first chip 101.

In addition, in the second embodiment, pads on the body 101A, as well as pads on the expanded portion 101B, of the first chip 101 are directly connected a substrate 103 via the second wires 106b. Consequently, wiring can be designed with low resistance even in a circuit configuration in which the semiconductor integrated circuit device 100A needs to operate at high speed. First wires 106a connected to the expanded portion 101B and the second wires 106b connected to the body 101A enable necessary bonding terminals to be provided on a portion of the principal surface of the substrate 103 facing a peripheral portion of the first chip 101. As a result, the number of terminals can be increased without a rise in cost for assembly.

Accordingly, the wiring resistance from the principal surface of the first chip 101 to the substrate 103 can be reduced, and thus, malfunctions of timing performance and function due to a variation in operating speed can be reduced. As a result, the function can be enhanced at low cost by increasing the number of terminals.

In addition, since no gap is formed between the second chips 102 and the substrate 103, the reliability of this integrated circuit device after assembly can be obtained.

Furthermore, in the second embodiment, the presence of the multiple second chips 102 enables the first chip 101 to have higher function.

In the second embodiment, the number of the second chips 102 is four. However, the number of the second chips 102 is not limited to four, and advantages similar to those in this embodiment can be obtained as long as the number of the second chips 102 is two or more.

(Variation of Second Embodiment)

Figure 8:
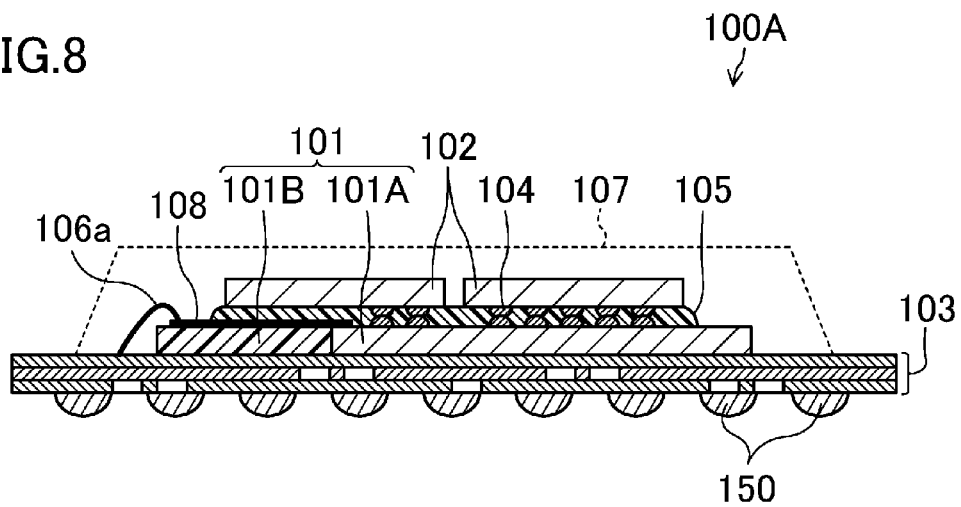
FIG. 8 is a cross-sectional view illustrating a semiconductor integrated circuit device according to a variation of the second embodiment and taken along line VIII-VIII in FIG. 9.
Figure 9:
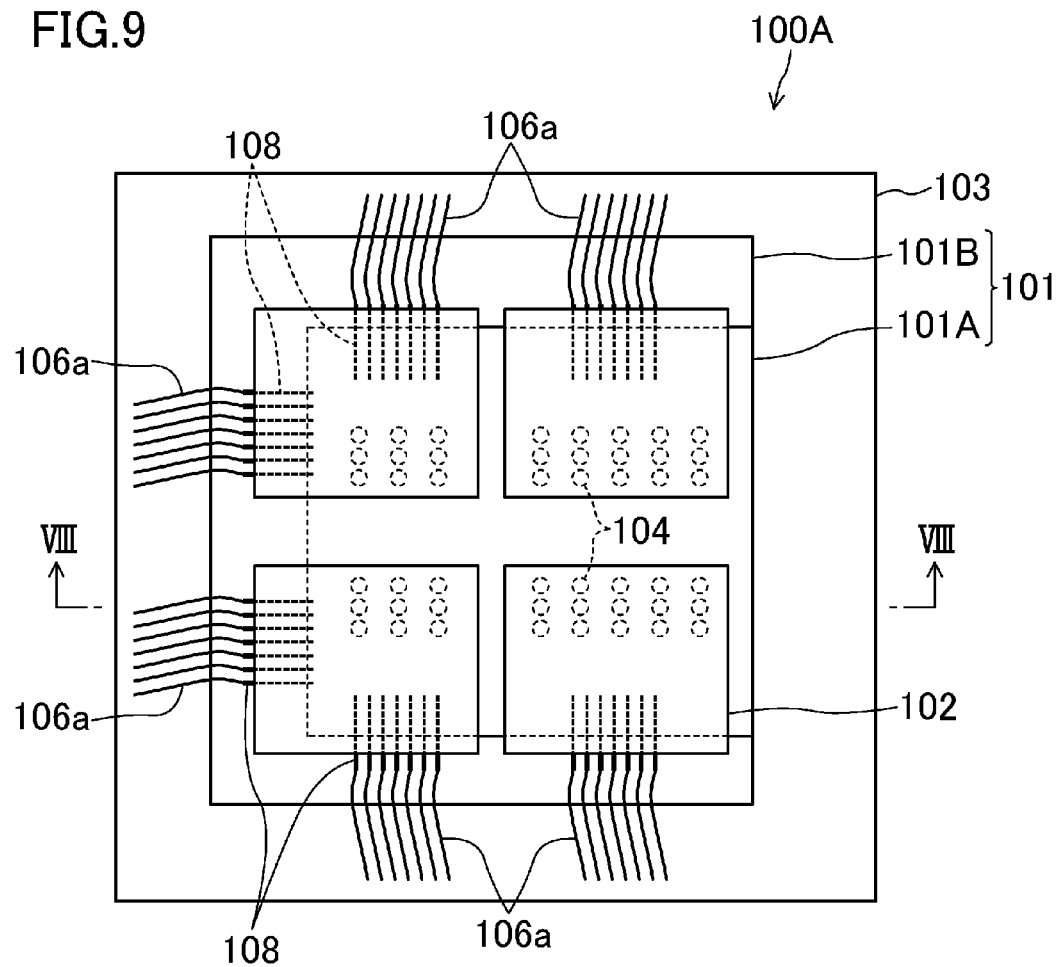
FIG. 9 is a plan view illustrating a semiconductor integrated circuit device according to a variation of the second embodiment.

As illustrated in FIGS. 8 and 9, in a semiconductor integrated circuit device 100A according to a variation of the second embodiment, the body 101A of the first chip 101 is not connected to the substrate 103 by second wires.

For example, if high-speed operation is not required for any of the first chip 101 and the second chips 102, the body 101A of the first chip 101 may not be directly connected to the substrate 103 via second wires in some cases.

The absence of second wires can reduce the outer shape of the semiconductor integrated circuit device 100A of this variation.

A configuration in which at least a side of the first chip 101 does not coincide with the associated side of the second chips 102 can avoid concentration of stress on the boundary between the body 101A and the expanded portion 101B in the first chip 101.

Third Embodiment

Figure 10:
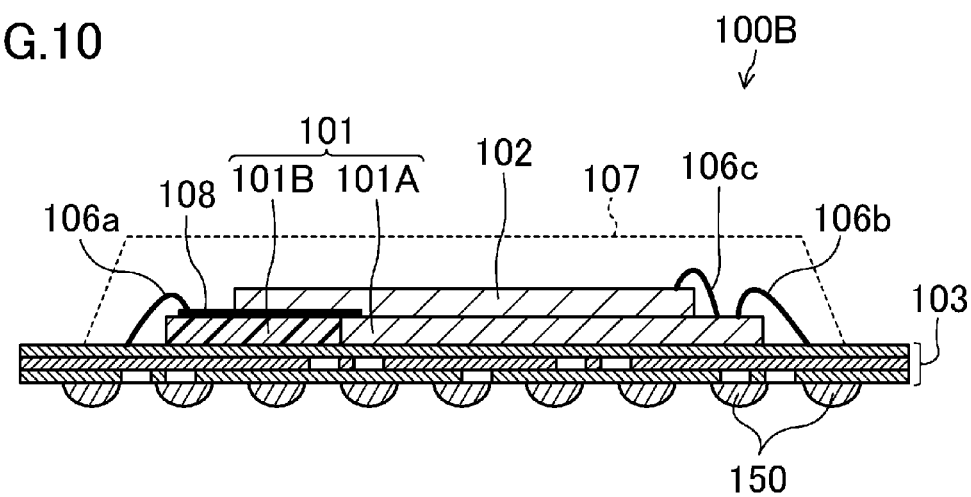
FIG. 10 is a cross-sectional view illustrating a semiconductor integrated circuit device according to a third embodiment and taken along line X-X in FIG. 11.
Figure 11:
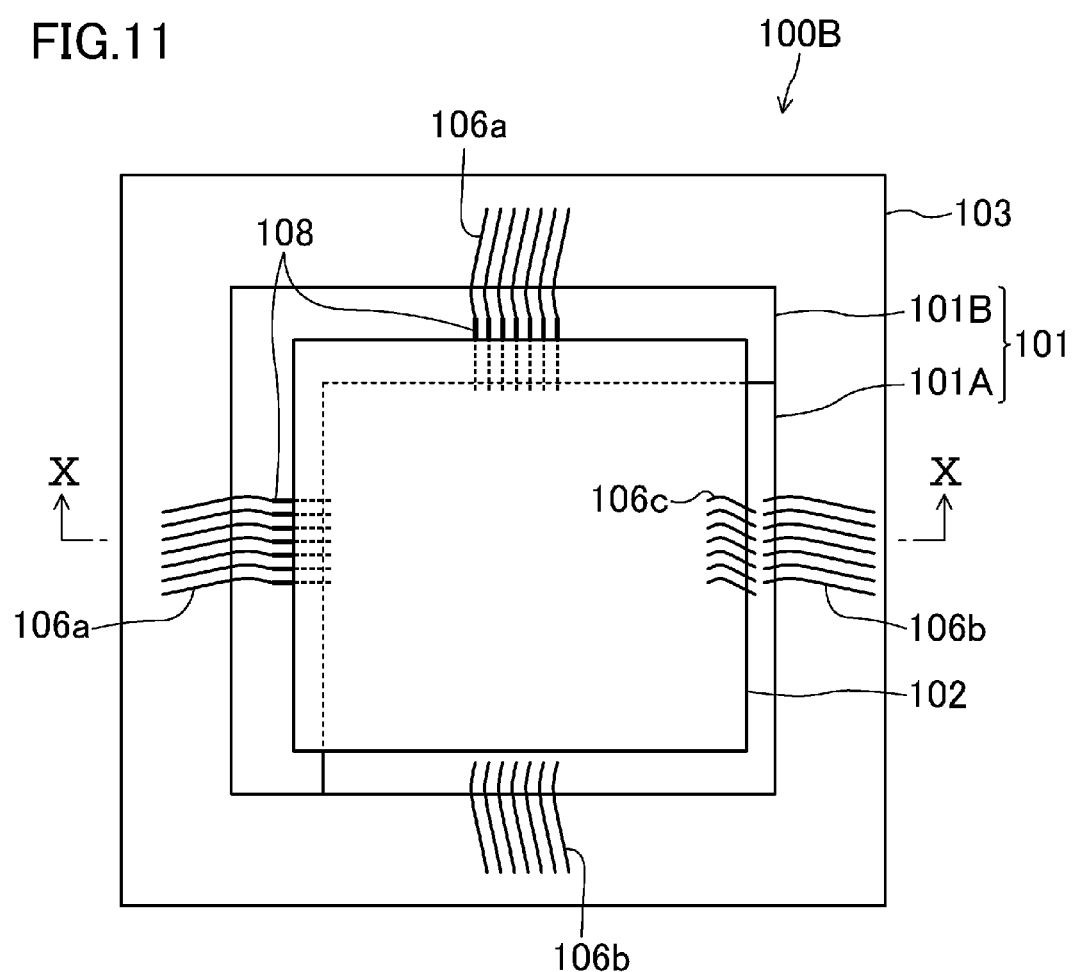
FIG. 11 is a plan view illustrating the semiconductor integrated circuit device of the third embodiment.

A semiconductor integrated circuit device according to a third embodiment of the present disclosure will be described with reference to FIGS. 10 and 11. In FIGS. 10 and 11, components already shown in FIGS. 1 and 2 are denoted by the same reference characters.

As illustrated in FIGS. 10 and 11, a semiconductor integrated circuit device 100B according to the third embodiment employs not a flip-chip structure in which an upper second chip 102 is flip-chip bonded to the principal surface of a lower first chip 101 but a COC structure in which an upper second chip 102 is bonded to the principal surface of a lower first chip 101 with the element formation surface of the second chip 102 facing upward. The second chip 102 is electrically connected to a body 101A of the first chip 101 by third wires 106c serving as a third conductive member.

The second chip 102 is disposed such that two sides of the second chip 102 are located outside the associated two sides of the first chip 101. Thus, an expanded portion 101B of the first chip 101 is provided on the two sides of the first chip 101 where the associated two sides of the second chip 102 are located outside the body 101A in plan view.

In the manner similar to that of the first embodiment, the other two sides of the principal surface of the body 101A of the first semiconductor chip 101 need to project outward from the sides of the second chip 102 so as to obtain a region on which second wires 106b and third wires 106c are provided.

The expanded portion 101B of the first chip 101 may be provided only on one side as illustrated in FIG. 3, or on three sides as illustrated in FIG. 4, depending on the chip size relationship between the first chip 101 and the second chip 102.

In the third embodiment, especially in a case where the chip size of the first chip 101 is equal to or smaller than that of the upper second chips 102, the presence of the expanded portion 101B provided on at least one side of the first chip 101 enables the number of bonding terminals on the first chip 101 to be increased irrespective of the size relationship of the lower first chip 101.

In addition, in the third embodiment, pads on the body 101A, as well as pads on the expanded portion 101B, of the first chip 101 are electrically connected a substrate 103 via the second wires 106b. Consequently, wiring can be designed with low resistance even in a circuit configuration in which the semiconductor integrated circuit device 100B needs to operate at high speed. First wires 106a connected to the expanded portion 101B and the second wires 106b connected to the body 101A enable necessary bonding terminals to be provided on a portion of the principal surface of the substrate 103 facing a peripheral portion of the first chip 101. As a result, the number of terminals can be increased without a rise in cost for assembly.

Accordingly, the wiring resistance from the principal surface of the first chip 101 to the substrate 103 can be reduced, and thus, malfunctions of timing performance and function due to a variation in operating speed can be reduced. As a result, the function can be enhanced at low cost by increasing the number of terminals.

In the third embodiment, a plurality of second chips 102 may be mounted on the lower first chip 101.

(Variation of Third Embodiment)

Figure 12:
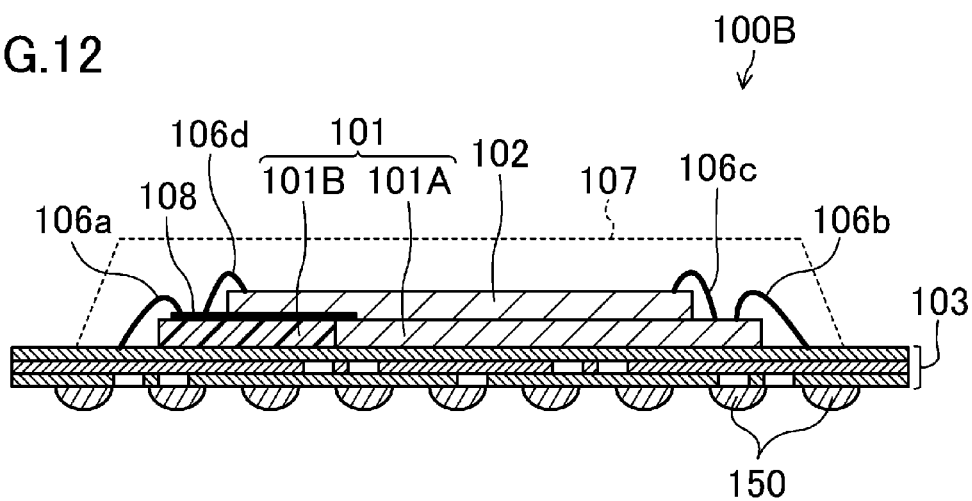
FIG. 12 is a cross-sectional view illustrating a semiconductor integrated circuit device according to a variation of the third embodiment and taken along line XII-XII in FIG. 13.
Figure 13:
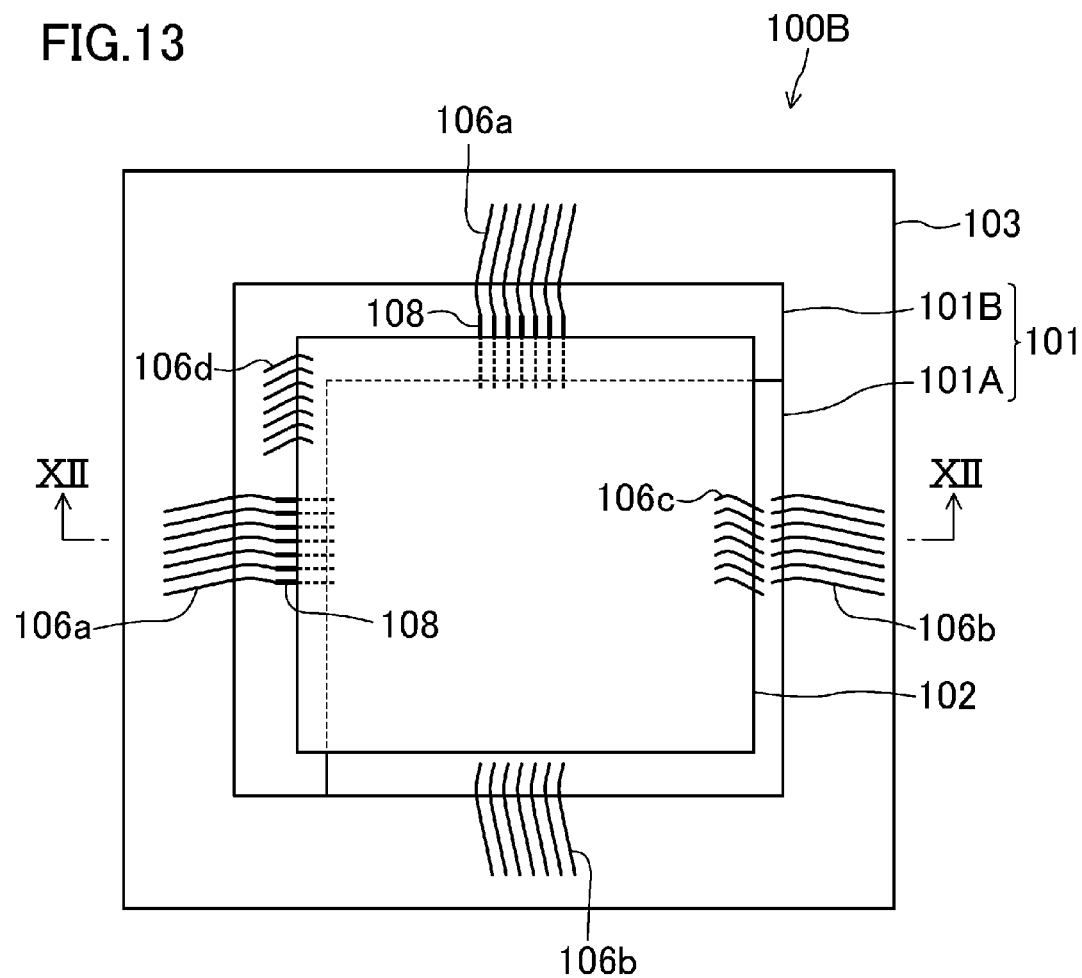
FIG. 13 is a plan view illustrating the semiconductor integrated circuit device of the variation of the third embodiment.

As illustrated in FIGS. 12 and 13, in a semiconductor integrated circuit device 100B according to a variation of the third embodiment, the element formation surface of the second chip 102 is electrically connected to the expanded portion 101B of the first chip 101 by fourth wires 106d serving as a fourth conductive member.

This configuration can enhance the degree of freedom in connecting the second chip 102 to the substrate 103 or connecting the second chip 102 to the first chip 101.

Although not shown, pads and re-distribution lines are provided at connection points of the expanded portion 101B of the first chip 101 to the fourth wires 106d.

In this variation, a plurality of second chips 102 may also be mounted on the lower first chip 101.

Fourth Embodiment

Figure 14:
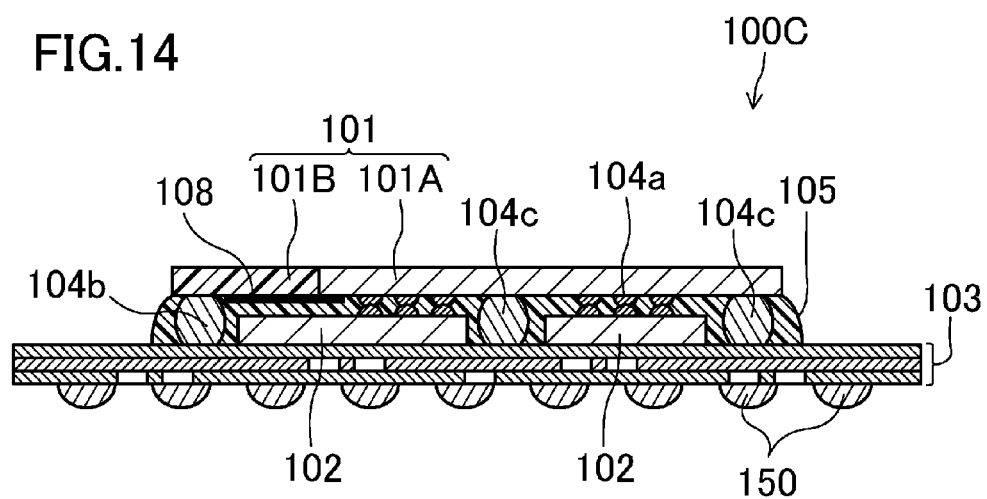
FIG. 14 is a cross-sectional view illustrating a semiconductor integrated circuit device according to a fourth embodiment and taken along line XIV-XIV in FIG. 15.
Figure 15:
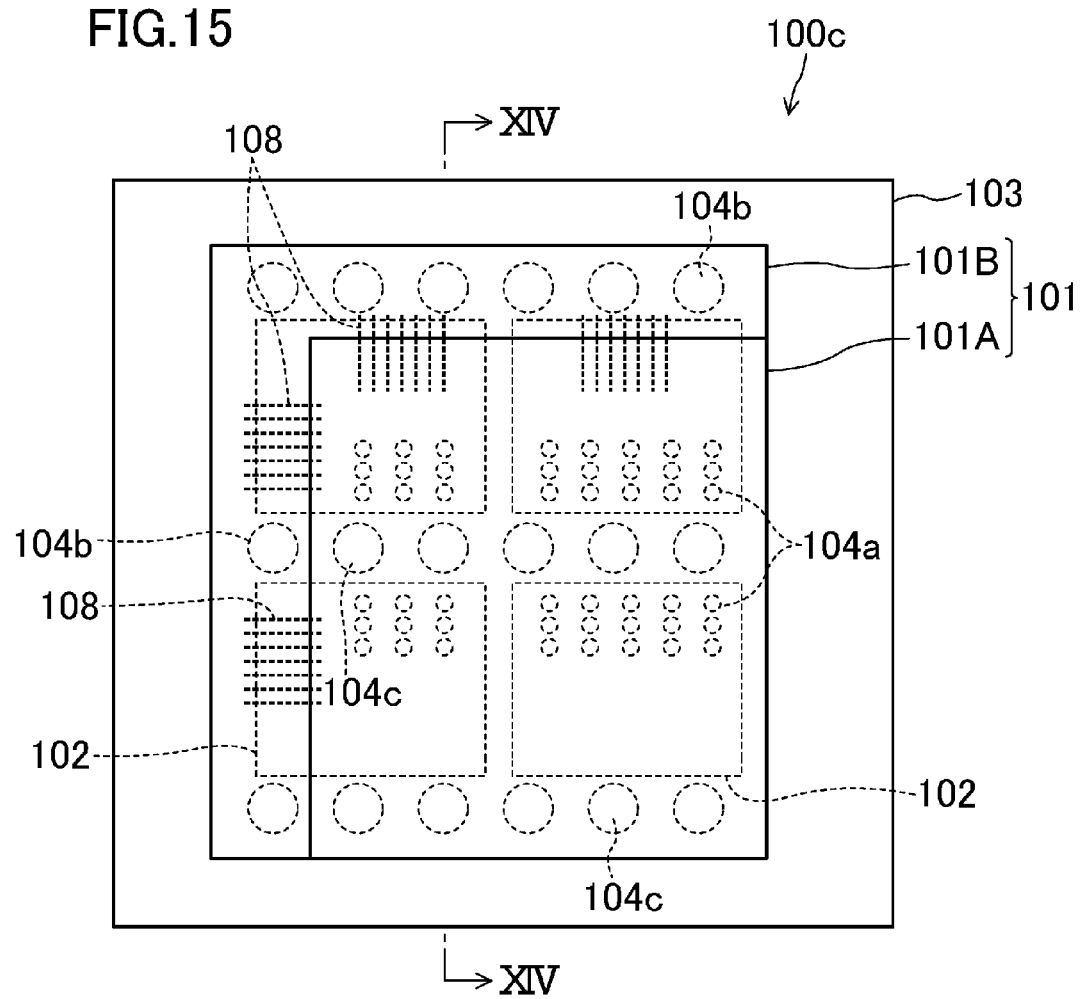
FIG. 15 is a plan view illustrating the semiconductor integrated circuit device of the fourth embodiment.
Figure 16:
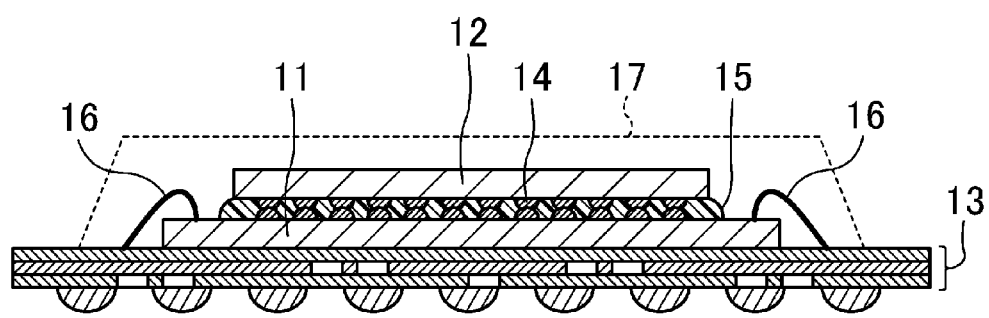
FIG. 16 is a cross-sectional view illustrating a semiconductor integrated circuit device with a conventional COC structure.

A semiconductor integrated circuit device according to a fourth embodiment of the present disclosure will be described with reference to FIGS. 14 and 15. In FIGS. 14 and 15, components already shown in FIGS. 1 and 2 are denoted by the same reference characters.

As illustrated in FIGS. 14 and 15, in a semiconductor integrated circuit device 100C according to the fourth embodiment, a plurality of second chips 102 are directly bonded to the principal surface of a substrate 103 with the element formation surfaces of the second chips 102 facing upward. A plurality of pads are provided on each of the element formation surfaces (i.e., the upper surfaces) of the second chips 102.

A first chip 101 includes a body 101A of a semiconductor and an expanded portion 101B expanding outward from two sides of the body 101A in parallel with associated two sides of the element formation surfaces (i.e., the lower surfaces). A plurality of pads are provided on the formation surface of the body 101A. The body 101A and the expanded portion 101B are electrically connected to each other via re-distribution lines 108 connected to the pads.

The re-distribution lines 108 are connected to pads for bumps on the expanded portion 101B, and electrically connected to the substrate 103 via second bumps 104b serving as a second conductive member. Pads on the body 101A are electrically connected to the substrate 103 via third bumps 104c.

The pads on the second chips 102 face a plurality of pads on the element formation surface of the first chip 101, and are electrically connected to the pads on the element formation surface of the first chip 101 via first bumps 104a serving as a first conductive member.

An underfill material 105 fills a gap surrounded by the first chip 101, the second chips 102, the second bumps 104b, and the third bumps 104c.

In this manner, the semiconductor integrated circuit device 100C of the fourth embodiment has a chip-on-chip (COC) structure in which the first chip 101 is flip-chip bonded to the second chips 102.

The first chip 101 including the expanded portion 101B and the underfill material may be covered with a molding resin.

In this structure, especially in a case where the chip size of the first chip 101 is equal to or smaller than the area necessary for mounting the lower second chips 102, the presence of the expanded portion 101B of the first chip 101 enables the number of bonding terminals on the first chip 101 to be increased irrespective of the size relationship of the upper first chip 101.

In addition, in the fourth embodiment, pads on the body 101A, as well as pads on the expanded portion 101B, of the first chip 101 are directly connected a substrate 103 via the third bump 104c. Consequently, wiring can be designed with low resistance even in a circuit configuration in which the semiconductor integrated circuit device 100C needs to operate at high speed. The second bumps 104b on the expanded portion 101B and the third bumps 104c on the body 101A enable necessary bonding terminals to be provided on a portion of the principal surface of the substrate 103 facing a peripheral portion of the first chip 101. As a result, the number of terminals can be increased without a rise in cost for assembly.

Accordingly, the wiring resistance from the principal surface of the first chip 101 to the substrate 103 can be reduced, and thus, malfunctions of timing performance and function due to a variation in operating speed can be reduced. As a result, the function can be enhanced at low cost by increasing the number of terminals.

In addition, in the fourth embodiment, the presence of the multiple second chips 102 enables the first chip 101 to have higher function.

Providing the third bumps 104c and the second bumps 104b on the body 101A and the expanded portion 101B of the first chip 101 and providing the third bumps 104c on a center portion of the first chip 102 can increase the number of terminals and enables bump connection suitable for high-speed operation.

In the foregoing embodiments and variations thereof, a wiring substrate including a stack of interconnect layers is used as the substrate 103. However, the substrate of the present disclosure is not limited to the substrate of this type, and may be a base including a conductive part. Examples of such a base include a lead frame.

The components of the first through fourth embodiments (including variations thereof) may be used in any suitable combination within the scope of the present disclosure.

For example, the bumps 104B on the expanded portion 101B of the semiconductor integrated circuit device of the first embodiment illustrated in FIG. 1 are applicable to the configurations except those of the third embodiment and the variation thereof.

A semiconductor device according to the present disclosure can achieve enhanced function by increasing the number of terminals, and is useful for, for example, semiconductor integrated circuit devices with chip-on-chip structures.

What is claimed is:

1. A semiconductor device comprising:
    a base; and
    a first semiconductor chip having an element formation surface and a body made of a semiconductor, mounted to a first surface of the base with the element formation surface facing to a direction opposite to the base, and including an expanded portion expanding outward from a side surface of the body, wherein
    the expanded portion of the first semiconductor chip is bonded to the first surface of the base by a first conductive member, and
    the body of the first semiconductor chip is bonded to the first surface of the base by a second conductive member.

2. The semiconductor device of claim 1, further comprising:
    a second semiconductor chip having an element formation surface, mounted to the first semiconductor chip with the element formation surface of the second semiconductor chip facing the base, and connected to the first semiconductor chip via a bump.

3. The semiconductor device of claim 1, further comprising:
    a second semiconductor chip having an element formation surface, mounted to the first semiconductor chip with the element formation surface of the second semiconductor chip facing to a direction opposite to the base, and bonded to the first semiconductor chip by a third conductive member.

4. The semiconductor device of claim 1, wherein
    the expanded portion of the first semiconductor chip is located only on one side of the body.

5. The semiconductor device of claim 1, wherein
    the expanded portion of the first semiconductor chip is located only on two adjacent sides of the body.

6. The semiconductor device of claim 1, wherein
    the expanded portion of the first semiconductor chip is located on three sides of the body.

7. The semiconductor device of claim 1, wherein
    a re-distribution line electrically connecting the first conductive member to the body is located on a portion of the element formation surface of the first semiconductor chip, and expands from the body to the expanded portion.

8. The semiconductor device of claim 1, wherein
    the base is a wiring substrate.

9. The semiconductor device of claim 1, wherein
    the base is a lead frame.

10. The semiconductor device of claim 2, wherein
    the bump is located on a portion of the first semiconductor chip except the expanded portion.

11. The semiconductor device of claim 2, wherein
    the second semiconductor chip comprises a plurality of semiconductor chips.

12. The semiconductor device of claim 2, wherein
    at least three sides of the body of the first semiconductor chip do not coincide with associated sides of the second semiconductor chip in plan view.

13. The semiconductor device of claim 2, wherein
    a side surface of the extension region of the first semiconductor chip is located outside an outermost side surface of the second semiconductor chip in plan view.

14. The semiconductor device of claim 3, wherein
    the third conductive member connects the body of the first semiconductor chip to the second semiconductor chip.

15. The semiconductor device of claim 3, wherein
    the third conductive member connects the expanded portion of the first semiconductor chip to the second semiconductor chip.

16. A semiconductor device comprising:
    a base;
    a first semiconductor chip having an element formation surface, and mounted to a first surface of the base with the element formation surface facing to a direction opposite to the base; and
    a second semiconductor chip having a body made of a semiconductor, mounted to the first semiconductor chip on the opposite side of the first semiconductor chip from the base, and including an expanded portion expanding outward from a side surface of the body, wherein
    the first semiconductor chip is connected to the second semiconductor chip via a bump,
    the expanded portion of the second semiconductor chip is connected to the first surface of the base by a first conductive member, and the body of the second semiconductor chip is connected to the first surface of the base by a second conductive member.

17. The semiconductor device of claim 16, wherein the first semiconductor chip is connected to the base only by the first conductive member and the second conductive member.

18. A semiconductor device comprising:

a base;

a first semiconductor chip having a body made of a semiconductor, mounted to a first surface of the base, and including an expanded portion expanding outward from a side surface of the body; and a second semiconductor chip mounted to the first semiconductor chip, wherein the expanded portion of the first semiconductor chip is bonded to the first surface of the base by a first conductive member, and the first semiconductor chip is connected to the base only by the first conductive member.

* * * * *